(12) United States Patent
Kurtz et al.

(10) Patent No.: US 12,259,435 B2
(45) Date of Patent: Mar. 25, 2025

(54) BATTERY MANAGEMENT SYSTEM FOR AN ELECTRIC AIR VEHICLE

(71) Applicant: Lilium eAircraft GmbH, Wessling (DE)

(72) Inventors: Johannes Kurtz, Grosskarolinenfeld (DE); Moritz Schuhmann, Munich (DE)

(73) Assignee: Lilium eAircraft GmbH, Wessling (DE)

( * ) Notice: Subject to any disclaimer, the term of this patent is extended or adjusted under 35 U.S.C. 154(b) by 211 days.

(21) Appl. No.: 17/651,749

(22) Filed: Feb. 18, 2022

(65) Prior Publication Data

US 2022/0268842 A1    Aug. 25, 2022

(30) Foreign Application Priority Data

Feb. 19, 2021   (EP) ..................................... 21158091

(51) Int. Cl.
*G01R 31/36* (2020.01)
*B60L 58/12* (2019.01)
(Continued)

(52) U.S. Cl.
CPC ............ *G01R 31/367* (2019.01); *B60L 58/12* (2019.02); *B60L 58/16* (2019.02);
(Continued)

(58) Field of Classification Search
CPC .............. G01R 31/367; G01R 31/3842; G01R 31/389; G01R 31/392; G01R 31/396;
(Continued)

(56) References Cited

U.S. PATENT DOCUMENTS

2007/0033435 A1* 2/2007 Stange ..................... G05B 9/03
714/15
2015/0100198 A1 4/2015 Vian et al.
(Continued)

FOREIGN PATENT DOCUMENTS

JP   2002-514757 A   5/2002
JP   2017-194284 A   10/2017
(Continued)

OTHER PUBLICATIONS

International Search Report for International Application No. PCT/EP2022/053088, mailed Apr. 25, 2022, 4 pages.
(Continued)

*Primary Examiner* — Catherine T. Rastovski
*Assistant Examiner* — Lal C Mang
(74) *Attorney, Agent, or Firm* — TraskBritt

(57) ABSTRACT

A battery management system and method for performing a battery state and, optionally, health parameter observation is disclosed, in particular, cell state-of-charge (SOC) observation, with two redundant, independent and dissimilar lanes. Specifically, a SOC determination in a first one of the lanes is based on Coulomb Counting. The other lane employs a different algorithm than Coulomb Counting. In some embodiments, a battery health observation is further performed independently by the two lanes, wherein the first lane employs an aging model and the other lane a different (dissimilar) algorithm. On the basis of state and health observation, state (state of function) of the battery system can be predicted to determine a range of flight in accordance with a predetermined flight profile.

14 Claims, 4 Drawing Sheets

(51) Int. Cl.
  *B60L 58/16* (2019.01)
  *G01R 31/367* (2019.01)
  *G01R 31/3842* (2019.01)
  *G01R 31/389* (2019.01)
  *G01R 31/392* (2019.01)
  *G01R 31/396* (2019.01)
  *H02J 7/00* (2006.01)

(52) U.S. Cl.
  CPC ....... *G01R 31/3842* (2019.01); *G01R 31/389* (2019.01); *G01R 31/392* (2019.01); *G01R 31/396* (2019.01); *H02J 7/0048* (2020.01); *H02J 7/005* (2020.01); *H02J 7/0069* (2020.01); *B60L 2200/10* (2013.01); *H02J 2310/44* (2020.01)

(58) Field of Classification Search
  CPC ............ G01R 31/3828; G01R 31/3647; G01R 31/008; G01R 31/388; G01R 31/3648; G01R 31/385; B60L 58/12; B60L 58/16; B60L 2200/10; B60L 3/0038; B60L 3/0092; B60L 2240/545; B60L 2240/547; B60L 2240/549; B60L 2250/10; H02J 7/0048; H02J 7/005; H02J 7/0069; H02J 2310/44
  See application file for complete search history.

(56) References Cited

U.S. PATENT DOCUMENTS

| | | | |
|---|---|---|---|
| 2017/0225584 A1 | 8/2017 | Jin et al. | |
| 2018/0019601 A1* | 1/2018 | Wang | H02J 7/0069 |
| 2018/0267110 A1* | 9/2018 | Kondo | G01R 31/392 |
| 2020/0277080 A1* | 9/2020 | Wiegman | B60L 50/60 |

FOREIGN PATENT DOCUMENTS

| | | |
|---|---|---|
| JP | 2018-529078 A | 10/2018 |
| KR | 10-1817396 B1 | 1/2018 |
| WO | 2016/157524 A1 | 10/2016 |
| WO | 2017/061066 A1 | 4/2017 |

OTHER PUBLICATIONS

International Written Opinion for International Application No. PCT/EP2022/053088, mailed Apr. 25, 2022, 6 pages.
European Extended Search Report from European Application No. 21158091.5, dated Aug. 19, 2021, 8 pages.
Japanese Office Action for Application No. 2023-550292 dated Oct. 22, 2024, 7 pages with English translation.

* cited by examiner

BATTERY MANAGEMENT SYSTEM FOR AN ELECTRIC AIR VEHICLE

CROSS-REFERENCE TO RELATED APPLICATION

Pursuant to 35 U.S.C. § 119(a), this application claims the benefit of the filing date of European Patent Application Serial No. 21158091.5, filed Feb. 19, 2021, for "Battery Management System For An Electric Air Vehicle," the disclosure of which is hereby incorporated herein in its entirety by this reference.

TECHNICAL FIELD

The present disclosure relates to battery management systems. More specifically, the present disclosure relates to battery management systems for health monitoring of an energy storage system of an electric air vehicle.

BACKGROUND

In recent years, electricity has gained increasing importance as a form of energy for driving air vehicles. This includes, in particular, electric aircrafts with vertical take-off and landing functionality (eVTOL).

A crucial component for electric (i.e., electrically driven/electrically propelled) aircrafts, including eVTOL, is an appropriate energy storage system (ESS). The energy storage system may be realized in the form of a battery system of chargeable batteries, which may be structured into a plurality of individual battery cells. Individual battery cells may be combined together to form one or more battery modules of an aircraft battery system used as an energy storage system. Examples of a battery type suitable for being used in the framework of the present disclosure include, but are not limited to, Lithium (Li)-ion batteries.

Generally speaking, the function of the energy storage system is to provide an electrically driven aircraft with sufficient accessible energy for safe flight and landing. As this is generally the case with respect to air traffic, the highest safety standards are applicable to the components of air vehicles, including the ESS. In order to ensure safe operation and, in particular, safe landing with a sufficient amount of remaining accessible energy, parameters of the ESS defining critical states that limit the amount of accessible energy must be monitored and communicated to an operator.

Such parameters include but are not limited to, for instance, a cell temperature or a state-of-charge (SOC) of individual battery cells of the ESS. As some of such parameters are not directly measurable quantities but relate to internal states, the design of the ESS must foresee appropriate equipment for a respective state observation. The state observation is based on the measurement of physical data, including but not being limited to terminal cell voltages, surface temperatures of cells or currents. Further, possibly residual errors in state determination have to be taken into account as potentially limiting the accessible energy and thus the range of an air vehicle. Such residual errors generally occur in view of the limited accuracy of any models used for describing the ESS and its states. Further, the accessible energy of a battery is highly dependent on the flight profile. Hence, the energy management system also has to perform a state prediction with regard to the planned flight profile until the electrically driven aircraft achieves safe landing. Specifically, in the framework of the present disclosure, terms like "monitoring" or "observation" are used to indicate that the respective data (state of function, health parameters) are determined not only at a particular point in time but their determination is repeated so as to gather information about their development over time, in particular, before and during a particular flight. Intervals of updating respective determinations may be set according to the circumstances and may, in particular, be set so small that a quasi-permanent observation is possible.

More generally speaking, it is distinguished between two types of relevant time dependent variables characterizing a battery system. On the one hand, (battery cell) states are defined by system variables that quickly evolve over time, i.e., in the order of seconds depending on the system input. Examples for cell states are the cell state-of-charge, cell core temperature or cell tab temperature. On the other hand, health parameters are system variables that slowly evolve over time, i.e., in the order of days, depending on the system input.

The significance of health parameter monitoring resides in the fact that the overall status of a battery, in addition to particular variables reflecting a current charging status, further depends on additional factors that may, in particular, reflect changes on a larger timescale during the life-cycle of the battery, such as aging, and that are summarized under the term "health parameters." In particular, battery health parameters may include without being limited to these, at least one of cell capacity and cell impedance.

It is therefore a crucial task during the design phase of the ESS that the maximum error of the state and health prediction for a planned flight is known and can be taken into account each time, during planning of an individual flight as well as during the flight itself, when the current status of the ESS, in particular the remaining accessible energy defining the remaining flight range, is to be determined. The planned profile defines the consumed power over time and shall be in strict accordance with the operational requirements of the aircraft. The maximum error metric in state prediction for the complete lifetime of the ESS shall be considered as the safety margin. This assures that the residual errors in state observation and state prediction do not particularly influence the utilization of the ESS within its known physical limits.

Therefore, a state prediction that is based on state and health parameter monitoring can assure that a planned profile does not violate any safety boundary until a safe landing has been achieved. This allows an operator to confirm the usable energy and range for a given mission at any time during a flight according to a particular profile and before landing.

A schematic representation of the tasks to be performed by an energy management system for state observation and state prediction during a flight according to a particular flight profile will be described below with reference to FIG. 1.

In the upper portion of FIG. 1, a diagram indicating the required power during the flight according to the profile over time is shown. As can be seen therefrom, the required power is particularly high immediately after take-off and in the final phase of the flight, before landing. In the example shown in the drawing, it is assumed that the current time, indicated by the symbol of an aircraft in a flight state, is in-between the take off and the beginning of the landing phase. Hence, with respect to the current time, the flight phase before lies in the past and the forthcoming flight phase shall be conducted in accordance with the planned flight profile. As further indicated, by means of a hatched box at the end of the flight, a certain amount of energy should remain available at the destination, for reasons of safety. Hence, the endpoint on the timescale is defined by the condition that the predetermined remaining energy is still accessible ("End Point Condition"). In other words, the indicated point later in time ("Physical Limit"), which might still be reachable on the basis of the remaining accessible energy, should never be considered as accessible in operation, in order to take into account uncertainties in state prediction.

During the flight, the state of the ESS is permanently monitored ("State Observation"). This includes but is not limited to physical measurements, model-based estimation, observation with the help of neural networks as well as model-based correction/calibration of measurement data. The state observation specifically observes a plurality of states of function (State of Function SOF). These may include but are not limited to, for instance, a cell state-of-charge (State of Charge SOC), a cell core temperature, a cell current connector temperature, a cell current, and an HV (high-voltage) cable temperature.

On the basis of the state observation during the flight phase before the current time (Past), a state prediction is performed for future points in time. In particular, the state prediction may include using look-up tables, model-based prediction and prediction using neural networks, without being limited to these. This enables a prediction of the state, for example the SOF listed above and indicated in the lower portion of the drawing, until the end of the planned flight profile, by taking into account any safety margin and residual errors determined in advance. In particular, as soon as the remaining accessible energy at the time of landing according to the planned flight profile falls below the predefined "Remaining Energy at Destination," an alert must be issued to the operator immediately so as to ensure safe landing at the nearest available airfield.

An erroneous determination of accessible energy leads to a catastrophic failure condition. This classification is derived from the assumption that the erroneous display of accessible energy would guide a pilot to conduct flight manoeuvers, especially flying distances, which the battery cannot sustain with sufficient energy for continued safe flight and landing.

As indicated above, parameters determining a battery state or health, in particular, a state-of-charge or impedance of a battery cell, are generally not directly measurable quantities. For this reason, a problem arises how to determine a battery state-of-charge or health in a reliable manner conforming to the highest safety requirements as applicable in air traffic and, in particular, for electric air vehicles.

BRIEF SUMMARY

The present disclosure provides a battery management system capable of determining and monitoring a battery state of an ESS for an electric air vehicle reliably and so as to comply with the high safety requirements applicable in air traffic, and a respective method.

This is achieved by the features of the independent claims.

According to a first aspect of the present disclosure, a battery management system for an electric air vehicle is provided. The battery management system is adapted to observe a current battery state-of-charge, SOC, of a battery system forming an energy storage system of the air vehicle. The battery management system comprises two redundant and dissimilar lanes for battery state determination. A first lane of the two lanes comprises equipment for determining SOC of each individual battery cell of a plurality of battery cells of the battery system by using a Coulomb Counting algorithm. A second lane of the two lanes comprises equipment for determining the SOC of each individual battery cell of the plurality of battery cells of the battery system using a different mechanism than the Coulomb Counting algorithm.

According to a second aspect of the present disclosure, a battery management method of observing a current battery state-of-charge, SOC, of a battery system forming an energy storage system of an electric air vehicle is provided. The battery management method comprises the steps of determining SOC of each individual battery cell of a plurality of battery cells of the battery system by using a mechanism that is based on a Coulomb Counting algorithm and of independently determining SOC of each individual battery cell of the plurality of battery cells of the battery system by using a different mechanism than the Coulomb Counting algorithm.

It is the particular approach of the present disclosure to combine a Coulomb Counting algorithm for determining the state-of-charge (SOC) of each battery cell of an energy storage system of an electric aircraft, in particular, an eVTOL, with another SOC determination algorithm, in an independent and redundant manner. In particular, in embodiments, the other SOC determination algorithm is a model-based algorithm. The SOC determination is performed by two redundant and dissimilar lanes, out of which one uses the Coulomb Counting algorithm. The fact that the two lanes are redundant means that each lane is capable of performing a full health parameter observation, of the ESS at any time, without the need to rely upon any determination made by the other lane. In other words, the measurements by the two lanes are completely independent from each other. The fact that the two lanes are dissimilar means that the algorithms for determining the SOC used by the two lanes are different with respect to each other.

An essential benefit of the approach of the present disclosure using Coulomb Counting resides in the fact that Coulomb Counting is a simple, easily-to-implement and highly deterministic SOC monitoring algorithm. This reduces the certification risk of the battery management system. For certification reasons, the eVTOL shall rely on two redundant and dissimilar means (lanes) of cell state-of-charge observation.

A further benefit of Coulomb Counting is the low complexity and thus low computation effort. In fact, Coulomb Counting requires just an integration. This saves weight and costs.

According to embodiments, the battery management system is further adapted for battery health observation. Each of the lanes further comprises equipment for determining a battery health parameter of each individual battery cell of the plurality of battery cells . The determination of the battery health parameter by the first lane is based on an aging model (for example, an empirical aging model) that determines the battery health based on observed utilization. The determination of the battery health parameter by the second lane is based on a different mechanism than the aging model. More specifically, the cell impedance and/or the cell capacity of each individual battery cell may be determined and monitored as a battery health parameter.

Electrical aircrafts and, in particular, eVTOL applications, are heavily dependent on a low cell impedance to provide the high hover power demands. An increased cell impedance is both the dominant cell aging mechanism and the dominant cell failure mechanism. Therefore, an increase in cell impedance significantly influences the available accessible energy, i.e., the range of an electric aircraft (eVTOL), and thus safety. Of course, analogous considerations apply for the cell capacity, which determines the amount of energy that can be saved in an ESS.

Therefore, it is important to take the current status of the health parameters of the battery system into account for the state (accessible energy prediction). Depending on the algorithm used, health parameter observation may be continued during the flight so as to permanently update the health parameters, or they may be assumed to remain constant during a flight, which is a reasonable assumption in view of the larger timescale of changes in health parameters as compared to battery state.

In embodiments, the equipment for determining a battery health parameter of the first lane comprises equipment for measuring the current, voltage and a temperature of each individual cell. Further, the equipment for determining a battery health parameter of the first lane may be supported by regularly performed maintenance procedures, wherein the maintenance procedures include at least representative charging procedures or the determination of pulse power profiles. Alternatively, designated maintenance procedures and/or charging procedures can also be used for battery health parameters monitoring instead of an algorithm based on an aging model.

In accordance with embodiments, an accessible amount of energy is determined on the basis of the SOC and optionally health parameter observation results in each of the two lanes, in order to determine the flight range based on a model-based state prediction for a planned flight profile. In particular, this is done in case no error in the data determination by the two lanes is detected.

In embodiments, the second lane uses a model-based SOC estimation algorithm and optionally a model-based cell parameter estimation algorithm for battery health state observation. More specifically, the model-based algorithms used by the second lane are based on using a dual Kalman filter.

Algorithms employed by the second lane are, however, not limited to model-based algorithms. Any other suitable algorithms a skilled person is aware of or will become aware of are equally suitable within the framework of the present disclosure. This includes, for instance, cell impedance (health parameter) determination by means of Electrochemical Impedance Spectroscopy (EIS).

According to embodiments employing EIS, the second lane comprises equipment for exciting battery cells of the battery system with sinusoidal current of variable frequency and equipment for measuring the voltage response of each cell. More specifically, the second lane further comprises processing circuitry for calculation of a system impedance spectrum based on a ratio between an input excitation current and voltage response. Based on the spectrum, various variables characterizing the battery state can be derived, including state-of-charge, as well as cell core temperature and cell tab temperature.

In accordance with embodiments, the equipment for performing SOC determination by using a Coulomb Counting algorithm in the first lane comprises equipment for determining the charging current for each individual cell of the plurality of battery cells constituting the battery system during ground operation and equipment for determining the overall load currents of each individual cell. More specifically, the equipment for performing SOC determination by using the Coulomb Counting algorithm in the first lane further comprises processing circuitry for calculation of a state-of-charge based on the determined charging current and overall load currents of each individual cell and integrating the measured currents over time. The state-of-charge is thus determined by the Coulomb Counting algorithm in a deterministic manner, on the basis of a balance of an amount of energy input to and an amount of energy output from the cell.

In embodiments, the second lane comprises battery cell measurement equipment for measuring at least one of a voltage (for example: a cell terminal voltage), a current (for example: an input or output current) and a temperature (for example: a surface temperature or a cell tab temperature). These parameters are accessible through measurement and may form a basis for calculating parameters indicating the battery state-of-charge and battery health according to well-known algorithms that take into account the particular hardware structure of the battery system and cells, including model-based algorithms.

In embodiments, the air vehicle is an electric vertical take-off and landing aircraft, eVTOL.

In accordance with a further particular aspect of the present disclosure, an air vehicle comprising a battery management system according to the above aspect or each of the embodiments is provided.

Further features and advantages of the present disclosure are set forth in dependent claims.

Embodiments and features of the present disclosure herein described or set forth in the appended claims may be combined unless it is obvious from the context that such a combination is not possible for particular embodiments or features.

BRIEF DESCRIPTION OF THE DRAWINGS

Additional features and advantages of the present disclosure will become apparent in the following and more particular description as illustrated in the accompanying drawings, wherein.

DETAILED DESCRIPTION

Figure 1:
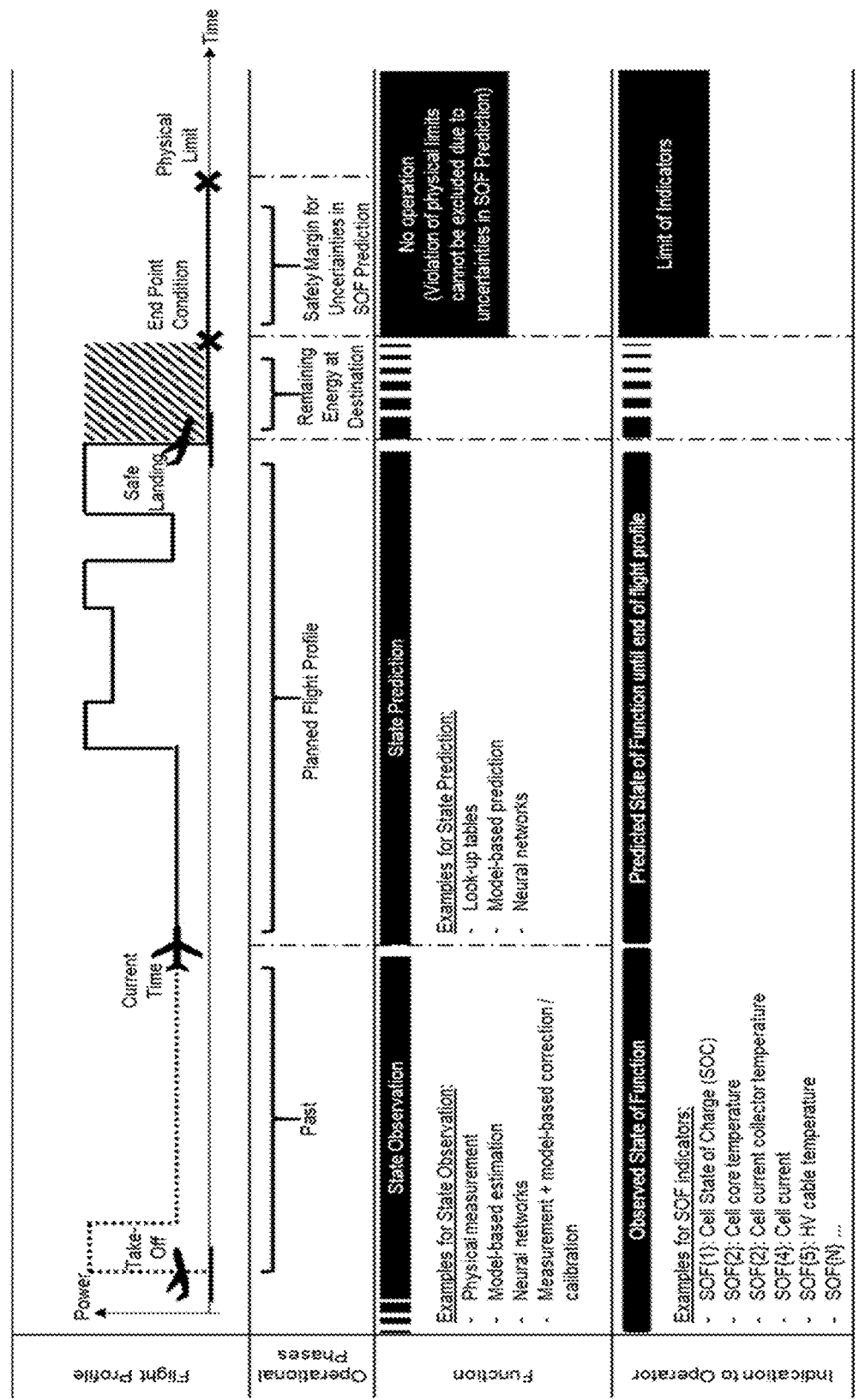
FIG. 1 is an overview diagram illustrating state observation and state prediction for an energy storage system of an air vehicle flying in accordance with a predetermined flight profile.

The present disclosure relates to a battery management system for electrically driven air vehicles, in particular, eVTOL, for determining a state-of-charge and optionally a battery health of a battery system forming an energy storage system (ESS). This enables the determination of an amount of accessible energy in the ESS so as to determine (predict) the flight range according to a predetermined flight profile, in particular, at any time during the flight.

For this purpose, embodiments of the present disclosure utilize an innovative two-lane battery management system architecture that provides two redundant and dissimilar lanes of battery state observation, out of which one determines a state-of-charge by means of Coulomb Counting. In embodiments, additionally a state of health is observed, wherein in one of the two lanes an aging model is employed.

According to the present disclosure, a first lane of the two lanes operates on the basis of Coulomb Counting for SOC determination. In preferred embodiments, an aging model is used in the first lane for battery health (SOH) determination. The first lane may further be capable to determine and monitor (observe) other state variables (states of function), such as cell core temperature, by using suitable algorithms different from and dissimilar to those used by the second lane.

A second lane of the two lanes operates on the basis of a different algorithm. In embodiments, this is a model-based SOC estimation algorithm, for instance, using a dual Kalman filter, for state-of-charge observation. Similarly, in accordance with embodiments, for battery health parameters observation, a cell parameter estimation algorithm, for instance, using a dual Kalman filter is used. In particular, the cell impedance and/or the cell capacity are used as a battery health parameter.

In each lane, a battery state may be predicted via a model-based state prediction for a planned flight profile on the basis of the observed state and optionally health parameters. Specifically, the battery state determines an accessible amount of energy for the flight according to the planned flight profile. The thus determined accessible energy, including a safety margin based on a predetermined maximum error of state prediction, determines the maximum range of the flight and may thus confirm that the planned destination can be safely reached.

Embodiments of the present disclosure provide an implementation of both SOC observation and battery parameter health observation in such a way as to fulfill the certification requirements to exclude single points of failure. This is achieved by implementing SOC observation and SOH observation in a redundant and dissimilar way, by two respective lanes determining the states in parallel.

According to embodiments, the battery cell measurements performed by the battery cell measurement equipment of each of the independent lanes are dissimilar to each other. Accordingly, the measurements of physically accessible parameters themselves contribute to the dissimilarity of the lanes. This avoids a situation wherein a system failure occurs due to any principal flaw in a measurement algorithm or principle. Examples for dissimilar measurement schemes are a scheme using PTC (Positive Temperature Coefficient) and a scheme using NTC (Negative Temperature Coefficient) elements for temperature measurements, a scheme using a shunt and a scheme using a Hall sensor for current measurements or schemes using two different ADC (analog-to-digital converter) suppliers for voltage measurement.

A detailed description of the operation of these two redundant and dissimilar lanes of battery SOC and health parameter observation during all flight phases will be given below with reference to FIG. 2.

Lane 1, illustrated in the bottom row of the drawing and corresponding to the second lane as introduced in the above summary of the disclosure, uses a conventional model-based SOC and health parameter estimation algorithm, for instance, using a dual Kalman filter, for state and health observation. Input to this algorithm is the current, voltage and temperature for each individual cell measured by respective measurement equipment of Lane 1. Output is the estimation of the SOC and health parameter for each individual cell. In order to obtain, from the measured parameters, the SOC and health parameter output, respective evaluations are performed on the basis of the model.

Model-based estimation algorithms are well known to a skilled person and a detailed description thereof will therefore be omitted here. They are used for estimating system variables of state that are not directly measurable, such as state-of-charge of a cell, cell core temperature, cell impedance or cell capacity. The approach of model-based algorithms is generally based on a comparison of measurable output variable values of a system having known input variable values with the output of a model of a system for the same input values, wherein at least one model parameter characterizing a variable of state to be estimated is regularly updated on the basis of a difference between the measured system output and the model output, as a feedback.

As input, the current, voltage and temperature for each individual cell measured by the battery cell measurement equipment of a lane employing model-based estimation is used. Estimated system variables are, for example, the SOC and health parameters for each individual cell. In addition, an inter-active update of results between model-based SOC estimation and model-based health estimation can be performed if both a model-based health estimation and a model-based SOC estimation are implemented, as illustrated. In the same manner, besides the SOC, further variables characterizing the battery state, for example the cell core temperature, can be obtained with a model-based algorithm in a similar way.

Lane 2 (illustrated in the middle row of the drawing and corresponding to the first lane introduced in the above summary of the disclosure), uses the Coulomb Counting algorithm for SOC monitoring. Input to the Coulomb Counting during ground operation is the charging current for each individual cell. In order to know the initial SOC, before the charging operation, the initial SOC is determined with the help of an open-circuit voltage (OCV) measurement, which takes into account, in particular, charge (energy) losses due to self-discharge of the battery system. This preliminary step is indicated on the left-hand side, in the box labeled "Reset of SOC with OCV Measurement."

Alternatively, other methods of resetting or recalibrating the SOC can be used, for example, by resetting the SOC to 100% when a charger determines that the battery is fully charged. A regular re-calibration in case of employing a Coulomb Counting algorithm is necessary for avoiding erroneous results due to long-term drift of the observation result.

During flight, the Coulomb Counting calculates the battery SOC based on all load currents for each individual cell. Output from the Coulomb Counting is the SOC for each individual cell.

Lane 2 further uses an aging model to determine the battery health based on the observed utilization. Examples for parameters characterizing the utilization of the battery system are charge (Ampere hours Ah) throughput, mean temperature and depth of discharge. Input to battery health observation by means of an empirical aging model are the current, voltage and temperature for each individual cell, as measured by the battery management equipment of Lane 2. In addition, this empirical model can be supported by dedicated (predetermined) maintenance procedures, where battery health parameters are determined by representative charging (and/or discharging) procedures or pulse power profiles. Output is the respective health parameter for each individual cell. As indicated above, important examples of health parameters are cell capacity and cell impedance.

Essentially, an aging model receives the utilization data of the ESS for each flight, which are collected by the battery management system (BMS). After each fight, the collected data are transmitted to a backend computer ("backend") located at a maintenance facility outside the air vehicle, where the respective data of the air vehicle component during its life cycle are maintained ("digital twin"). These data may contain, for example, the cell temperature distribution, voltage distribution, current distribution, and charge throughput (Ampere hours Ah), without being limited to these. A benefit in using the data distributions or integrated values rather than each individual data point resides in the fact that the stored (i.e., during the flight, in the BMS) and transferred (to the backend) data volume is drastically reduced. The aging model is calibrated by the cell aging that was observed during lab testing and correlates the observed utilization of the last flight or last flights with the expected evolution of the battery health parameter according to the calibrated model.

In view of the nature of the algorithm for health observation using an aging model, no health parameter update is possible during the flight in this case. Generally, in view of the comparatively long timescale of changes of the health parameters as compared to the actual battery state, it is sufficient to assume that the health parameters remain constant during the flight so during flight constant health parameters (i.e., the same that were determined immediately before the flight) are used in state prediction. Alternatively, it may be possible to extrapolate the battery health development during the flight from the battery health history of previous determinations (worst-case scenario).

As indicated above, (empirical) aging algorithms can be supplemented by dedicated charging/discharging procedures and maintenance procedures for health parameter determination.

A dedicated charging or discharging procedure enables the calculation of the present total capacity of the battery cell, as a health parameter of the ESS, when charging/discharging a cell with predefined fixed charging conditions and environmental conditions, starting from a fixed initial charging state so as to reach a fixed final charging state. More specifically, a dedicated charging procedure may include one of the following procedures (basic principles):

1) At least one cell of the ESS shall reach the lower cell voltage limit when discharged by a predefined constant current and at a predefined stable cell temperature. The ESS reaches thereby the "fully discharged" state. The present total capacity of the ESS is the quantity of charge that would be charged from this fully discharged state with a pre-defined constant current and a pre-defined constant temperature until at least one cell of the ESS reaches the upper cell voltage limit.

2) At least one cell of the ESS shall reach the upper cell voltage limit when charged by a pre-defined constant current and a pre-defined stable cell temperature. The ESS reaches thereby the "fully charged" state. The present total capacity of the ESS is the quantity of charge would be discharged from this fully charged state with a pre-defined constant current and at a pre-defined constant temperature until at least one cell of the ESS reaches the lower cell voltage limit.

These two procedures can subsequently be repeated several times to mitigate hysteresis and coulombic efficiency effects, which distort the calculation of the present total capacity.

A dedicated maintenance procedure may include, for instance, a pulse power test.

A pulse power test calculates the cell impedance of an ESS at a pre-defined cell temperature and cell SOC by measuring the voltage response of a cell (system response) when exposed to charging or discharging current (current pulses) of different magnitudes (system excitation). The cell internal resistance at given SOC and temperature can be calculated as the difference of voltage response divided by the difference of the cell current, which is a general approach to determine system properties.

It is noted that in the framework of the present disclosure, all measurements and observations are made at the level of individual battery cells. For an evaluation, such as for the determination of an accessible energy or range prediction, as well as a potential failure prediction, in view of the high safety requirements in air traffic, always the cell having lowest capabilities is taken as the basis.

As further illustrated in the drawing, in each of the lanes the observation results are used for state prediction. The state prediction thus takes into account the up-to-date cell states as well as the up-to date health parameters. The state prediction serves to report (confirm) whether there is sufficient available energy for the planned flight. The flight profile, in particular, determines the required power over time for the planned flight, which may be calculated in advance, during the flight planning phase, on the basis of such input as an aircraft model, a weather model and a path model, for instance, by a flight management system (FMS).

As further illustrated, the thus determined available energy (range based on the planned flight profile) is displayed to an operator (pilot) of the aircraft. This is implemented separately in each of the independent and dissimilar lanes. Hence, the operator has a display separately provided for each of the lanes and can thus compare the results. The operator may compare the separately displayed state prediction results from the two lanes with each other. If there is a deviation between the predicted states from the two lanes and if the magnitude of this deviation exceeds a predetermined threshold, the deviation may prompt an alert to an operator. The operator shall then approach the closest airfield (vertiport in case of an eVTOL) possible for safe landing. In any case, the operator can personally compare the state prediction results and decide whether the indication is reliable or an emergency landing is necessary.

During normal operation, i.e., when there is no large deviation, a minimum value of the displayed range (available accessible energy) of both lanes will be used as a basis for any decisions. In this framework, a "minimum value" means a value that corresponds to the lowest amount of remaining accessible energy, i.e., the lowest range (remaining safe flight distance). The same principle is applied for an overall assessment of the battery system on the basis of measurements and observations relating to individual cells. As a basis for the assessment, always the cell is taken, for which a "minimum value" in the sense explained above of an observed state or health parameter is determined.

As further illustrated in the top line of the drawing, the respective operations by both the lanes are continually performed both before the flight (in particular: during charging operation of the battery system) and during the flight between take-off and landing (with the exception of the health monitoring based on aging model, as indicated above).

Figure 3:
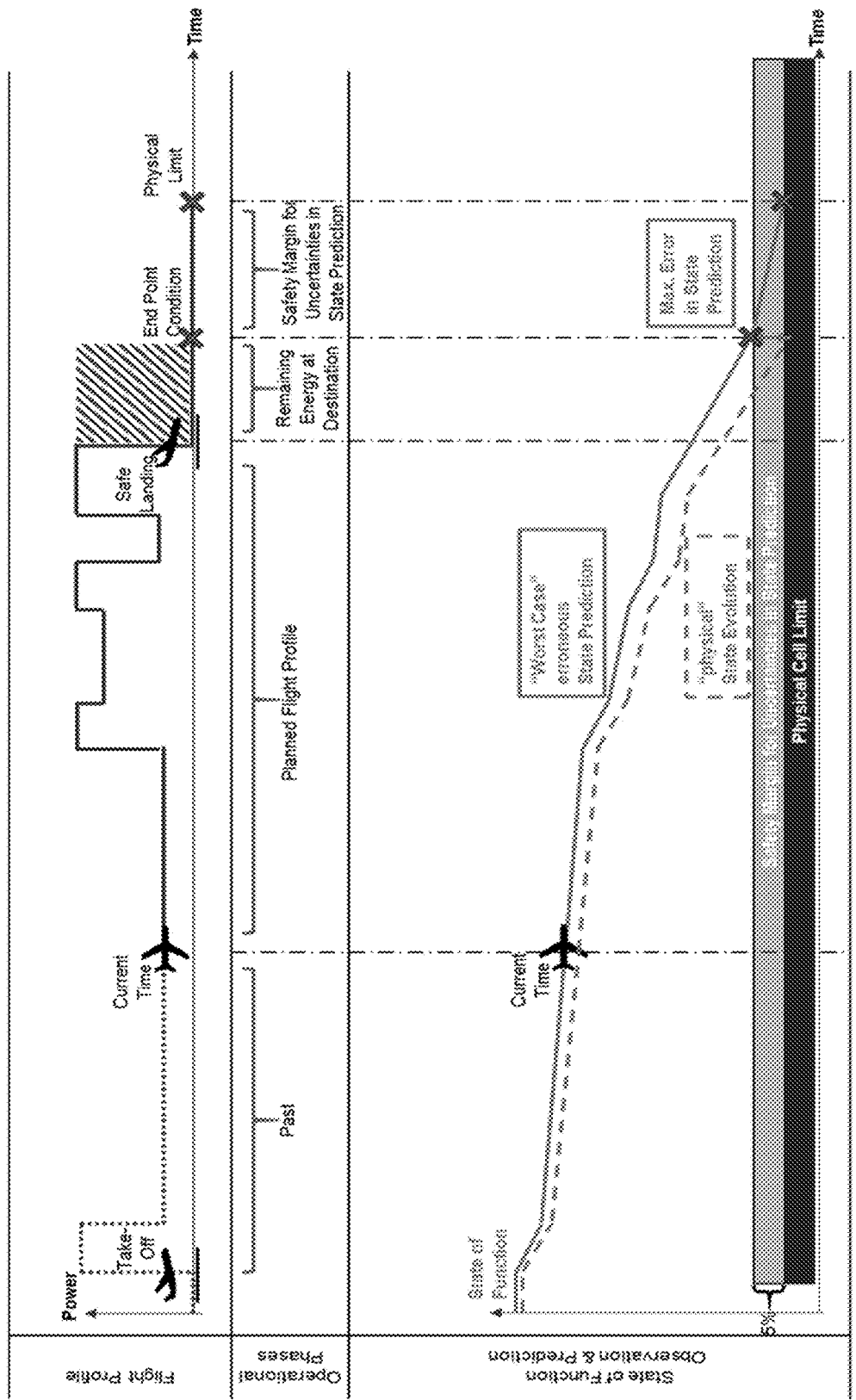
FIG. 3 is a diagram showing details of state prediction during a flight according to a planned flight profile using state-of-charge and battery health observation in accordance with embodiments of the present disclosure.

FIG. 3 illustrates, how the results of the battery state, in particular SOC and health parameter observation can be used to determine the accessible energy for the air vehicle via a model-based state prediction.

The upper portion of the diagram in FIG. 3 repeats the upper portion of FIG. 1 and shows a diagram indicating the required power during the flight according to the flight profile.

The lower portion of the diagram shows how the redundant and dissimilar lanes allow the calculation of the current system state of function, in particular, SOC. Based on the observed battery health parameter, the planned flight profile can be used to predict the SOC evolution of each individual cell until the aircraft reached a safe landing condition. A planned flight profile is only valid if the state prediction excludes the violation of a limit. Therefore, the range of an aircraft, in particular, an eVTOL, can be determined based on (multiple) flight profiles and destinations outside the range of the aircraft can already be safely excluded before take-off.

In order to comply with high safety requirements, a maximum error of the state prediction for a planned flight shall be known in advance (e.g., during the planning phase of the ESS) so as to be taken into account each time, during planning of an individual flight as well as during the flight itself. In the lower portion of the diagram of FIG. 3, the maximum error of state prediction is shown by the distance between the dotted and the dashed line in the diagram showing the state-of-charge observation prediction result over time. This error shall be measured during lab testing and considered as a safety margin for uncertainties in state prediction.

More specifically, the solid line (upper one of the two lines) labeled "Worst Case erroneous State Prediction" corresponds to the SOC evaluation result for the flight according to the planned flight profile under the assumption that said maximum error is present. The label "Worst Case" refers to the fact that this prediction includes a maximal overestimation of the available resources (capability), i.e., corresponds to the "worst case" from the point of view of the pilot. The actual available ("physical") capability may be lower than the worst case estimate by the "maximum error," which corresponds to the difference between the solid line and the dotted line. As explained above with reference to FIG. 1 there must be some remaining accessible energy at the point of destination, for safety reasons ("End Point Condition"). This corresponds to the 5% safety margin for uncertainties in state prediction illustrated in the lower portion of FIG. 3.

The dotted line (lower one of the two lines) labeled "physical state evolution" illustrates the actual remaining state of function (for example: state-of-charge) in case of a prediction with maximum error according to the solid line, i.e., it proceeds lower of the solid line by a distance corresponding to the maximum error. As will be readily understood by a skilled person, with increasing flight distance the uncertainty of the prediction and thus the error determining the distance between the two lines increases. As a result, at the planned endpoint of the flight (destination) the maximum error in state prediction must not exceed the planned safety margin (in the present example: 5% corresponding to the maximum error at the end point). This guarantees the possibility of a safe flight and landing even in case of prediction with maximum error.

Figure 4:
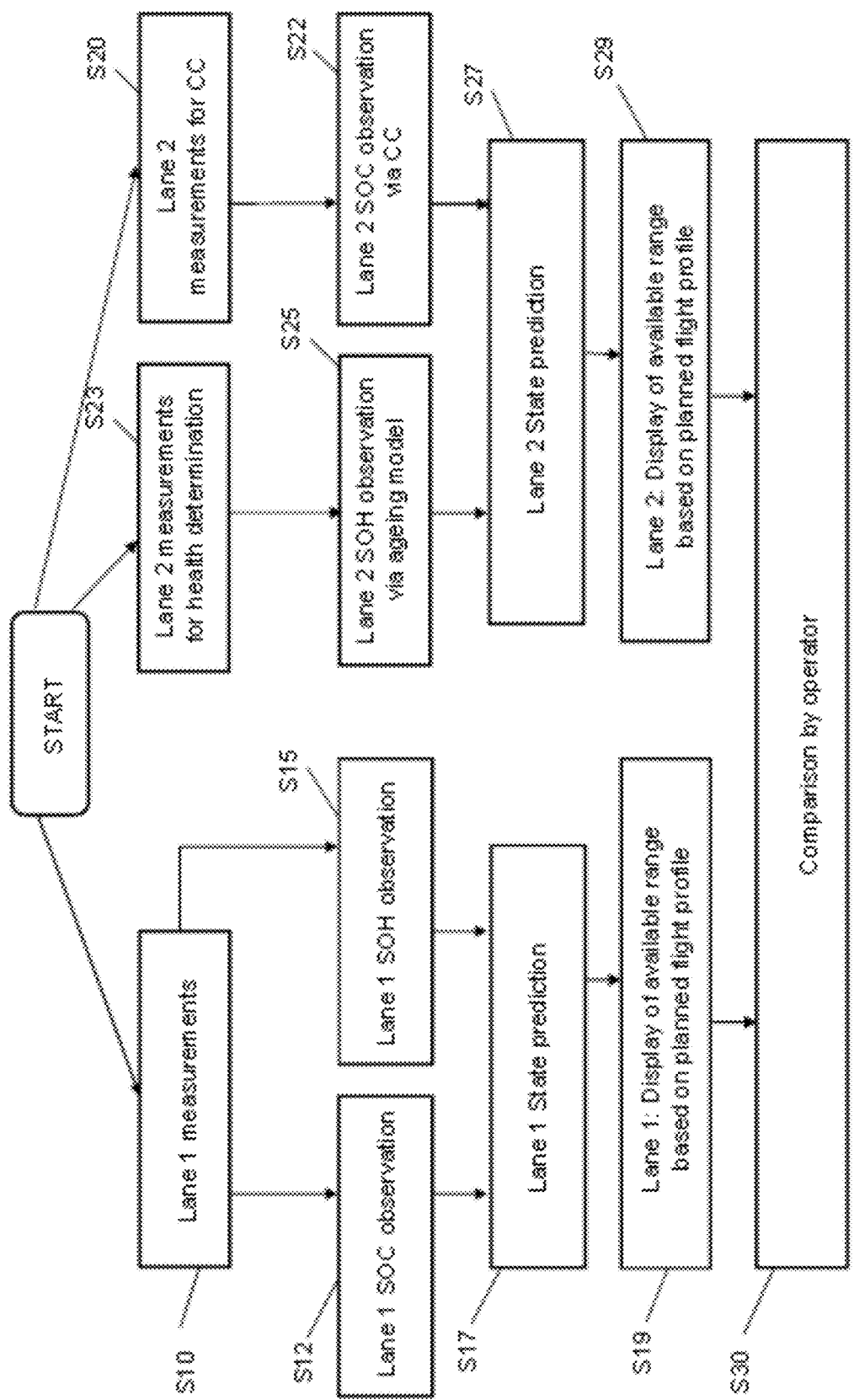
FIG. 4 is a flowchart illustrating basic steps of an exemplary battery management method.

FIG. 4 is a flowchart of an exemplary method that can be performed by a battery management system (BMS) according to embodiments of the present disclosure.

Figure 2:
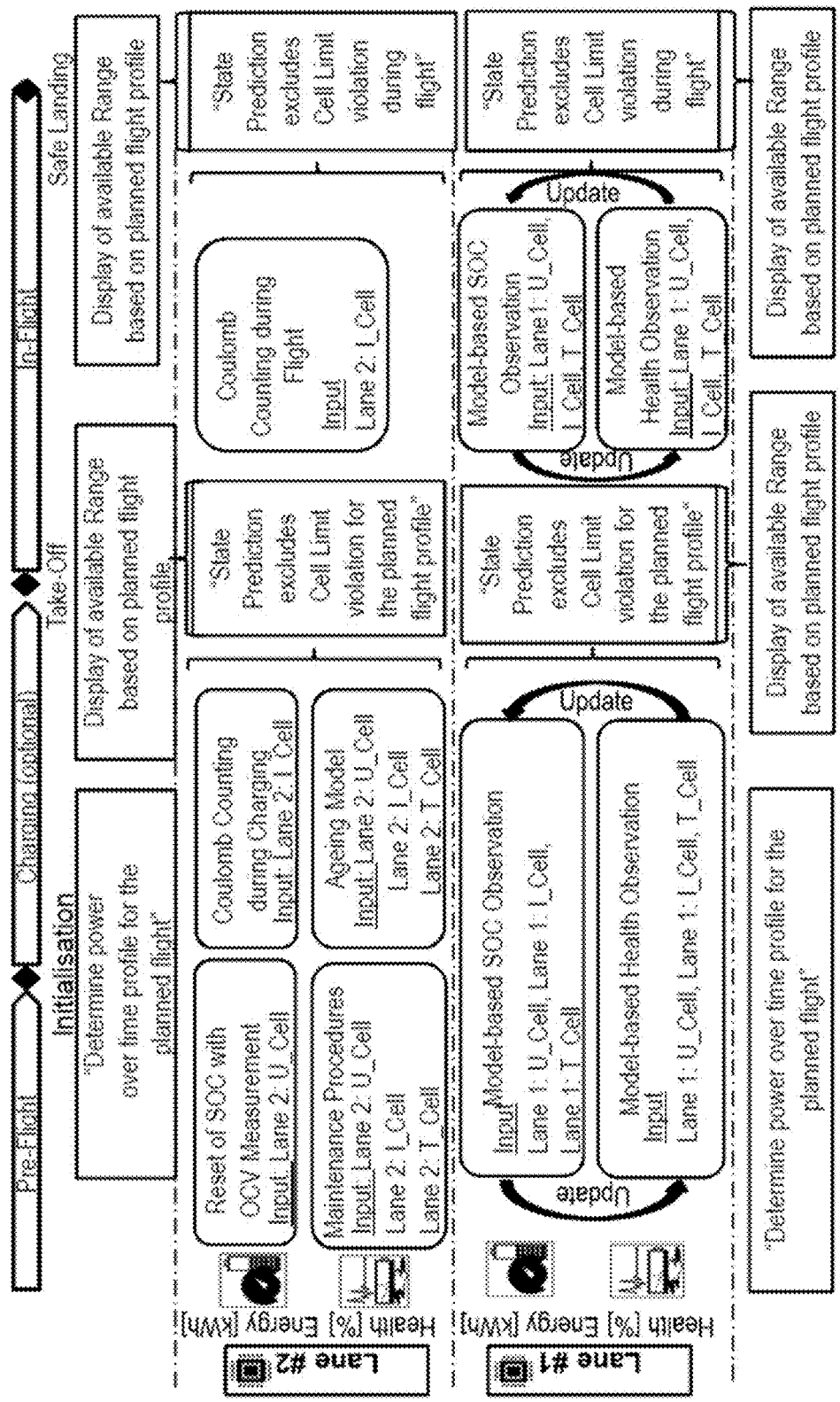
FIG. 2 is a diagram showing the operation of a two-lane battery management system for state and health observation in accordance with embodiments of the present disclosure in the phases before and during a flight.

In the upper portion of the flowchart, on the left-hand side, the operation performed by Lane 1 illustrated in the lower portion of FIG. 2 is illustrated. Specifically, in step S10, respective measurements are performed at the individual battery cells. This includes, in particular, measurements of cell voltages, currents and temperatures.

In subsequent step S12, a state-of-charge, SOC is derived on the basis of the measurements. In embodiments, this is done using a model-based approach, wherein the SOC is derived from an equivalent circuit model. Optionally, further a cell core temperature can be derived from the cell temperature measurement. In embodiments, this is done using a model-based approach as well, wherein the cell core temperature is derived from an equivalent circuit model as well. However, processing by Lane 1 is not limited to this, but any other approach, different from Coulomb Counting, can be used by Lane 1 as well. In parallel, step S15 performs a determination of the cell impedance and/or a cell capacity as an SOH parameter. In embodiments, this is done by using a model-based approach as well. In that case, relevant parameters of the equivalent circuit model are updated online during estimation and between state (SOC) and SOH estimation, as illustrated in FIG. 2. Again, processing by Lane 1 is not limited to this but any other approach, different from an aging model, can be used for SOH estimation in Lane 1 as well.

Processing then proceeds to step S17, wherein the individual determination results obtained (estimated) by Lane 1 are used as a basis for predicting the battery state, i.e., the remaining accessible energy defining the remaining range according to the planned flight profile. In the following step S19, a respective display to an operator is made on a first display (or first display portion) corresponding to the prediction by the Lane 1. The display can be implemented in various forms, such as by graphical representation or a numerical or symbolic indicator, whatever is suitable for easily and quickly grasping the situation and, in particular, a possible forthcoming emergency.

On the right-hand side of the upper portion of the flowchart, the respective operation performed by Lane 2 illustrated in the middle portion of FIG. 2 is shown. Specifically, in step S20 the measurements for performing the Coulomb Counting (CC) for SOC determination of each cell of the battery system are performed as described above. Hence, this includes a count of the overall input current of each individual cell during charging on the ground after the SOC has been reset by OCV measurement and the count of the overall load currents of each individual cell during the flight (integrated over time).

In step S22, for each cell, SOC is derived on the basis of the measurements in step S20.

In parallel, step S23 performs the necessary measurements for health parameter determination by means of employing an (empirical) aging model. As indicated above, this includes, in particular, measuring the current, voltage and temperature for each individual cell.

Step S25 determines health parameters such as cell impedance and/or cell capacity of each individual battery cell on the basis of the measurements in step S23.

Processing then proceeds to step S27, wherein the individual determination results obtained by Lane 2 are used as a basis for predicting the battery state, i.e., the remaining accessible energy defining the remaining range according to the planned flight profile. In the following step S29, a respective display to an operator is made on a second display (or second display portion) corresponding to the prediction by Lane 2. Again, the display can be implemented in various forms, such as by graphical representation or a numerical or symbolic indicator.

In final step S30, an operator compares the displayed state prediction results. In particular, an operator may conclude the presence of an error in at least one of the lanes, if a difference between a state prediction result of a particular variable by Lane 1 and Lane 2 exceeds a predetermined threshold, and decide to initiate a landing procedure at the nearest available airfield, because no reliable prediction regarding remaining accessible energy is possible in case of a failure in one of the lanes. A comparison may also be performed by the system and issue an alert to the operator if an error is detected based on too large a deviation between the lanes.

In summary, the present disclosure relates to a battery management system and method for performing a battery state and optionally health parameter observation, in particular cell state-of-charge (SOC) observation, with two redundant, independent and dissimilar lanes. Specifically, a SOC observation in a first one of the lanes is based on Coulomb Counting. The other lane employs a different algorithm than Coulomb Counting. In embodiments, a battery health observation is further performed independently by the two lanes, wherein the first lane employs an aging model and the other lane a different (dissimilar) algorithm. On the basis of state and health observation, state (state of function) of the battery system can be predicted to determine a range of flight in accordance with a predetermined flight profile.

What is claimed is:

1. A battery management system for an electric air vehicle, the battery management system being adapted to observe a current battery state-of-charge ("SOC") of a battery system forming an energy storage system of the electric air vehicle, the battery management system comprising:
   two redundant and dissimilar lanes for battery state determination, comprising:
      a first lane of the two redundant and dissimilar lanes comprising equipment for determining a SOC of each individual battery cell of a plurality of battery cells of the battery system using a Coulomb Counting algorithm; and
      a second lane of the two redundant and dissimilar lanes comprising equipment for determining the SOC of each individual battery cell of the plurality of battery cells of the battery system using a different mechanism than the Coulomb Counting algorithm, wherein:
   each of the two redundant and dissimilar lanes further comprises equipment for determining a battery health parameter of each individual battery cell of the plurality of battery cells;
   the determination of the battery health parameter by the first lane is based on an ageing model that determines the battery health parameter based on an observed utilization, the observed utilization including current, voltage, and temperature measured by the equipment for determining the battery health parameter of the first lane of the two redundant and dissimilar lanes; and
   the determination of the battery health parameter by the second lane is based on a different mechanism than the ageing model.

2. The battery management system according to claim 1, wherein cell impedance or cell capacity of each individual battery cell is used as the battery health parameter.

3. The battery management system according to claim 1, wherein the equipment for determining the battery health parameter of the first lane comprises equipment for measuring the current, the voltage and the temperature of each individual cell.

4. The battery management system according to claim 1, wherein the second lane uses a model-based SOC estimation algorithm.

5. The battery management system according to claim 1, wherein the equipment for performing the SOC determination using the Coulomb Counting algorithm in the first lane comprises: equipment for determining charging currents for each individual cell of the plurality of battery cells constituting the battery system during ground operation and equipment for determining overall load currents of each individual cell.

6. The battery management system according to claim 5, wherein the equipment for performing SOC determination using the Coulomb Counting algorithm in the first lane further comprises: processing circuitry for calculation of a state-of charge based on the determined charging currents and overall load currents of each individual cell.

7. The battery management system according to claim 1, wherein the equipment for determining the battery health parameter of the second lane comprises: equipment for measuring at least one of the current, the voltage and the temperature of each individual cell of the plurality of battery cells of the battery system.

8. The battery management system according to claim 1, wherein the electric air vehicle is an electric vertical take-off and landing aircraft (eVTOL).

9. A battery management method of observing a current battery state-of-charge ("SOC") and battery health of a battery system forming an energy storage system of an electric air vehicle, the battery management method comprising the steps of:
   determining SOC of each individual battery cell of a plurality of battery cells of the battery system using a mechanism that is based on a Coulomb Counting algorithm;
   independently determining SOC of each individual battery cell of the plurality of battery cells of the battery system using a different mechanism than the Coulomb Counting algorithm;
   determining a battery health parameter of each individual battery cell of the plurality of battery cells based on a mechanism using an ageing model that determines the battery health parameter based on an observed utilization, the observed utilization including current. voltage, and temperature; and
   independently determining the battery health parameter of each individual battery cell of the plurality of battery cells based on a different mechanism than the ageing model.

10. The method according to claim 9, wherein cell impedance or cell capacity of each individual battery cell is used as the battery health parameter.

11. An electric air vehicle comprising a battery management system, the battery management system adapted to observe a current battery state-of-charge ("SOC") of a battery system forming an energy storage system of the electric air vehicle, the battery management system comprising:
   two redundant and dissimilar lanes for battery state determination, comprising:
      a first lane of the two redundant and dissimilar lanes comprising equipment for determining a SOC of each individual battery cell of a plurality of battery cells of the battery system using a Coulomb Counting algorithm; and
      a second lane of the two redundant and dissimilar lanes comprising equipment for determining the SOC of each individual battery cell of the plurality of battery cells of the battery system using a different mechanism than the Coulomb Counting algorithm, wherein:

each of the two redundant and dissimilar lanes further comprises equipment for determining a battery health parameter of each individual battery cell of the plurality of battery cells;

the determination of the battery health parameter by the first lane is based on an ageing model that determines the battery health parameter based on an observed utilization, the observed utilization including current, voltage, and temperature measured by the equipment for determining the battery health parameter of the first lane of the two redundant and dissimilar lanes; and the determination of the battery health parameter by the second lane is based on a different mechanism than the ageing model.

12. The air vehicle according to claim 11, wherein cell impedance or cell capacity of each individual battery cell is used as the battery health parameter.

13. The air vehicle according to claim 11, wherein the second lane uses a model-based SOC estimation algorithm.

14. The air vehicle according to claim 11, wherein the equipment for performing the SOC determination using the Coulomb Counting algorithm in the first lane or the second lane comprises equipment for determining charging currents for each individual cell of the plurality of battery cells constituting the battery system during ground operation and equipment for determining overall load currents of each individual cell.

* * * * *

UNITED STATES PATENT AND TRADEMARK OFFICE
CERTIFICATE OF CORRECTION

PATENT NO. : 12,259,435 B2  
APPLICATION NO. : 17/651749  
DATED : March 25, 2025  
INVENTOR(S) : Johannes Kurtz and Moritz Schuhmann Page 1 of 1

It is certified that error appears in the above-identified patent and that said Letters Patent is hereby corrected as shown below:

In the Specification

| | | |
|---|---|---|
| Column 4, | Line 49, | change "battery cells . The" to --battery cells. The-- |
| Column 11, | Line 61, | change "battery cells . This" to --battery cells. This-- |

In the Claims

Claim 9, Column 14, Line 40, change "including current. voltage," to --including current, voltage,--

Signed and Sealed this  
Twentieth Day of May, 2025

Coke Morgan Stewart  
*Acting Director of the United States Patent and Trademark Office*